United States Patent
Ellis-Monaghan et al.

(10) Patent No.: US 7,652,313 B2
(45) Date of Patent: Jan. 26, 2010

(54) DEEP TRENCH CONTACT AND ISOLATION OF BURIED PHOTODETECTORS

(75) Inventors: John J. Ellis-Monaghan, Grand Isle, VT (US); Jeffrey P. Gambino, Westford, VT (US); Jeffrey B. Johnson, Essex Junction, VT (US); Jerome B. Lasky, Essex Junction, VT (US)

(73) Assignee: International Business Machines Corporation, Armonk, NY (US)

(*) Notice: Subject to any disclaimer, the term of this patent is extended or adjusted under 35 U.S.C. 154(b) by 185 days.

(21) Appl. No.: 11/164,098

(22) Filed: Nov. 10, 2005

(65) Prior Publication Data

US 2007/0102740 A1    May 10, 2007

(51) Int. Cl.
  *H01L 31/062* (2006.01)
(52) U.S. Cl. .................. 257/292; 257/291
(58) Field of Classification Search ............. 257/292, 257/290, 291
  See application file for complete search history.

(56) References Cited

U.S. PATENT DOCUMENTS

| 4,377,817 A | * | 3/1983 | Nishizawa et al. ........... 257/258 |
| 4,450,466 A | * | 5/1984 | Nishizawa et al. ........... 257/292 |
| 4,571,815 A | * | 2/1986 | Baliga et al. ................. 438/137 |
| 4,937,648 A | * | 6/1990 | Huang ........................ 257/517 |
| 5,825,071 A | * | 10/1998 | Takakura .................... 257/440 |
| 5,965,875 A | | 10/1999 | Merrill |
| 6,204,087 B1 | | 3/2001 | Parker et al. |
| 6,611,037 B1 | | 8/2003 | Rhodes |
| 6,707,095 B1 | | 3/2004 | Chidambarrao et al. |
| 6,727,521 B2 | | 4/2004 | Merrill |
| 6,730,980 B2 | | 5/2004 | Rhodes |
| 6,787,819 B2 | | 9/2004 | Rhodes et al. |
| 6,838,742 B2 | | 1/2005 | Rhodes |
| 6,858,460 B2 | | 2/2005 | Rhodes et al. |
| 6,949,445 B2 | * | 9/2005 | Rhodes et al. .............. 438/424 |
| 7,102,184 B2 | * | 9/2006 | Rhodes ........................ 257/292 |
| 2006/0145202 A1 | * | 7/2006 | Sawase et al. ............... 257/291 |

FOREIGN PATENT DOCUMENTS

| JP | 62103972 A | | 5/1987 |
| JP | 9213917 A | | 8/1997 |
| JP | 2002057319 A | | 2/2002 |
| JP | 2003007993 A | | 1/2003 |
| WO | WO 2005/001939 A1 | * | 1/2005 |

* cited by examiner

*Primary Examiner*—Wai-Sing Louie
*Assistant Examiner*—Bilkis Jahan
(74) *Attorney, Agent, or Firm*—Anthony J. Canale; Hoffman Warnick LLC (57) ABSTRACT

The invention provides vertically-stacked photodiodes buried in a semiconductor material that are isolated and selectively contacted by deep trenches. One embodiment of the invention provides a pixel sensor comprising: a plurality of photosensitive elements formed in a substrate, each photosensitive element being adapted to generate photocharges in response to electromagnetic radiation; and a plurality of photocharge transfer devices, each photocharge transfer device being coupled to at least one of the plurality of photosensitive elements.

20 Claims, 10 Drawing Sheets

DEEP TRENCH CONTACT AND ISOLATION OF BURIED PHOTODETECTORS

BACKGROUND OF THE INVENTION

1. Technical Field

The invention relates generally to photodetectors, and more particularly, to the use of deep trenches to contact and isolate vertically-stacked photodiodes buried in a semiconductor material.

2. Background Art

Pixel sensors and multiple wavelength pixel sensors are known in the art. Vertically-stacked multiple-wavelength pixel sensors have also been employed to reduce the surface area of the device occupied by such sensors.

Figure 1A:
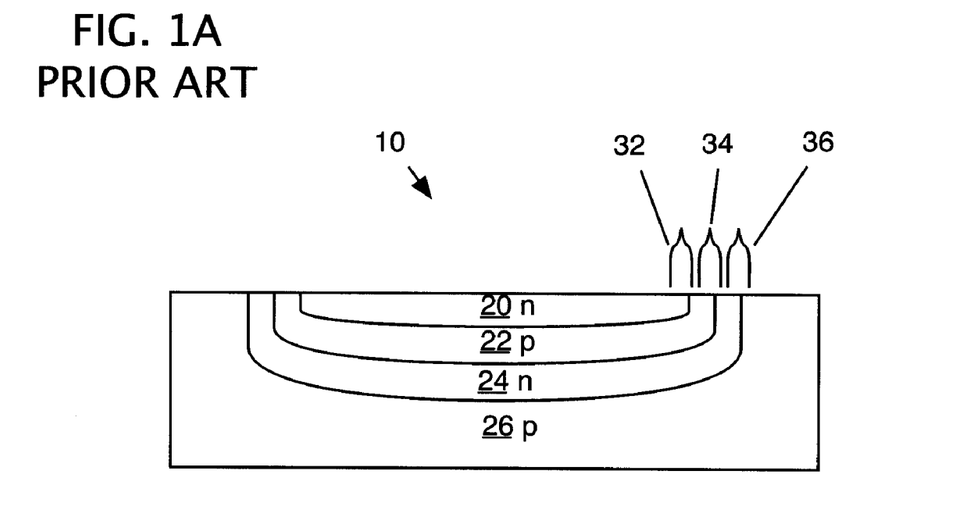
FIGS. 1A-B show cross-sectional views of prior art devices.

For example, referring first to FIG. 1A, a cross-sectional view of a vertically stacked multiple wavelength pixel sensor 10 is shown, such as that disclosed in U.S. Pat. No. 5,965,875 to Merrill. As shown, pixel sensor 10 includes four alternating, oppositely-doped semiconductor layers. The junction between n-type well 20 and p-type well 22 comprises a first photodiode 32. The junction between p-type well 22 and n-type well 24 comprises a second photodiode 34. The junction between n-type well 24 and p-type substrate 26 comprises a third photodiode 36. Each of the first photodiode 32, second photodiode 34, and third photodiode 36 is adapted to respond to a different wavelength of electromagnetic radiation. For example, first photodiode 32 is adapted to respond to blue light of approximately 450 nm, second photodiode 34 is adapted to respond to green light of approximately 550 nm, and third photodiode 36 is adapted to respond to red light of approximately 650 nm. The sensitivity of each photodiode to a particular wavelength is determined, primarily, by its depth within pixel sensor 10, as is known in the art.

A significant drawback of such an arrangement, however, is that the photodiodes 32, 34, 36 are connected in series and of alternating polarity, i.e., first photodiode 32 and third photodiode 36 are of one polarity and second photodiode 34 is of an opposite polarity. Such an arrangement requires modified circuits or voltage ranges and may require PMOS access transistors in addition to the usual NMOS access transistors, which increases and complicates the circuitry of pixel sensor 10.

Figure 1B:
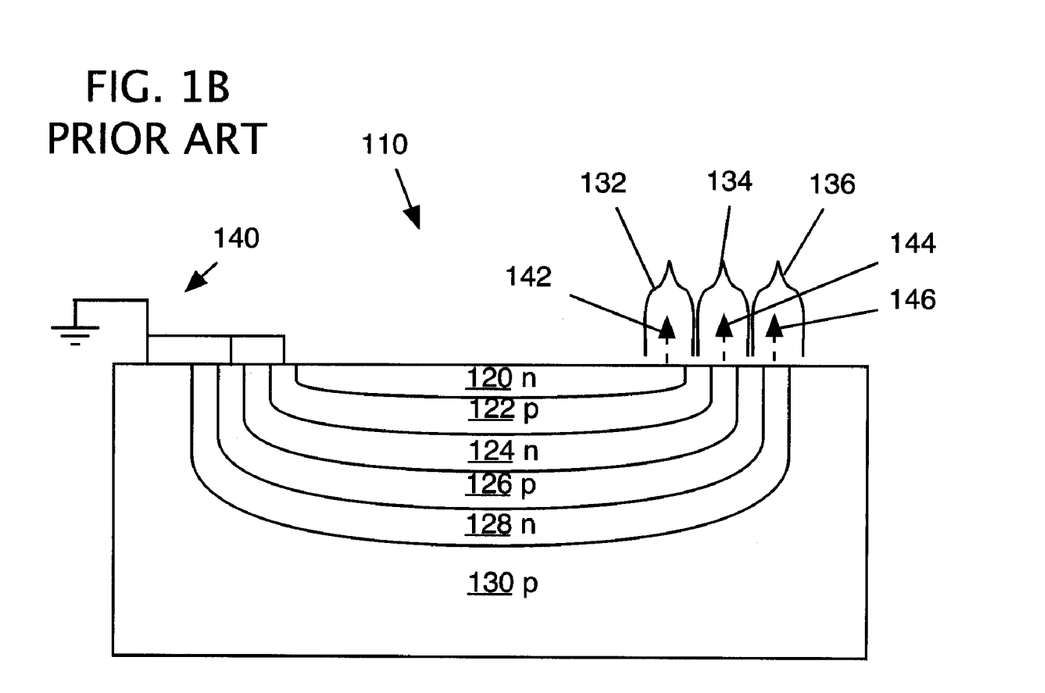

In order to eliminate these disadvantages of sensor 10 of FIG. 1A, additional wells of alternating, oppositely-charged semiconductor layers may be employed. FIG. 1B shows a pixel sensor 110 having six alternating, oppositely-charged semiconductor layers. As in FIG. 1A, the junction between n-type well 120 and p-type well 122 comprises first photodiode 132. However, unlike sensor 10 of FIG. 1A, second photodiode 134 comprises p-type well 122, n-type well 124, and p-type well 126. P-type wells 122, 126 act as the anode and n-type well 124 acts as the cathode of second photodiode 134. Similarly, third photodiode 136 comprises p-type wells 126, 130 acting as the anode and n-type well 128 acting as the cathode. As in FIG. 1A, p-type well 130 may be a semiconductor substrate or another p-type well.

In order to ensure that each photodiode has the same polarity, the output 142, 144, 146 of each photodiode 132, 134, 136 is taken from the n-type cathode 120, 124, 128, while the p-type anodes 122, 126, 130 are coupled to a fixed potential such as a ground 140. Thus, pixel sensor 110 avoids the drawbacks associated with serially-connected photodiodes of alternating polarity.

However, significant drawbacks remain in devices such as that of FIG. 1B. Crosstalk between adjacent sensors is common, due to their lack of isolation. In addition, the fact that the upper-most layer in known devices is an n-type layer (20 in FIG. 1A; 120 in FIG. 1B) leads to electron generation at the surface of the sensor 10, 110. Surface electron generation increases dark current in a sensor.

Further, sensor 110 still relies on "reachthrough" diffusions. Reachthrough diffusions suffer from at least two significant drawbacks. First, in order to efficiently contact photodiodes buried deep in a semiconductor substrate, the columns of dopant, e.g., the vertical portions of 120, 122, etc. (FIG. 1B), must be heavily doped Second, in order to introduce the dopant deep enough into the substrate, high-energy implants or long, high-temperature anneals must be used. Both high dopant concentrations and high implant energies create damage to the silicon, increasing dark current and thus degrading the photodiode signal-to-noise ratio. Further, high energy implants and long, high temperature furnace anneals will result in wide columns of dopant, with the width of the column being proportional to the depth. Thus a large pixel area penalty must be paid the for the use of reachthrough diffusions as the photodiode contacting method.

To this extent, a need exists for photodiodes and related structures that do not suffer from the defects described above.

SUMMARY OF THE INVENTION

The invention provides vertically-stacked photodiodes buried in a semiconductor material that are isolated and selectively contacted by deep trenches.

A first aspect of the invention provides a pixel sensor comprising: a plurality of photosensitive elements formed in a substrate, each photosensitive element being adapted to generate photocharges in response to electromagnetic radiation; and a plurality of photocharge transfer devices, each photocharge transfer device being coupled to at least one of the plurality of photosensitive elements.

A second aspect of the invention provides a pixel sensor comprising: a plurality of photodiodes formed in a substrate, each photodiode including a p-n junction; a plurality of photocharge transfer devices, each photocharge transfer device being coupled to at least one of the plurality of photodiodes; and at least one of the following: a heavily-doped p-type layer adjacent at least one photocharge transfer device and a p-type well of at least one photodiode; a blocking p-type layer adjacent a p-type well of at least one photodiode; and a shallow trench isolation adjacent at least one of the photocharge transfer devices.

A third aspect of the invention provides a method of forming a contact to a buried photodiode, the method comprising: forming a trench in a substrate adjacent the photodiode; applying an insulating material to an inner surface of the trench; and filling the trench with a polysilicon.

A fourth aspect of the invention provides a pixel sensor comprising: a plurality of photosensitive elements formed in a substrate, each photosensitive element being adapted to generate photocharges in response to electromagnetic radiation; at least one photocharge transfer device coupled to at least one of the plurality of photosensitive elements; and a deep trench in the substrate surrounding each of the plurality of photosensitive elements and the at least one photocharge transfer device.

The illustrative aspects of the present invention are designed to solve the problems herein described and other problems not discussed, which are discoverable by a skilled artisan.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

As indicated above, the invention provides vertically-stacked photodiodes buried in a semiconductor material that are isolated and selectively contacted by deep trenches.

Figure 2:
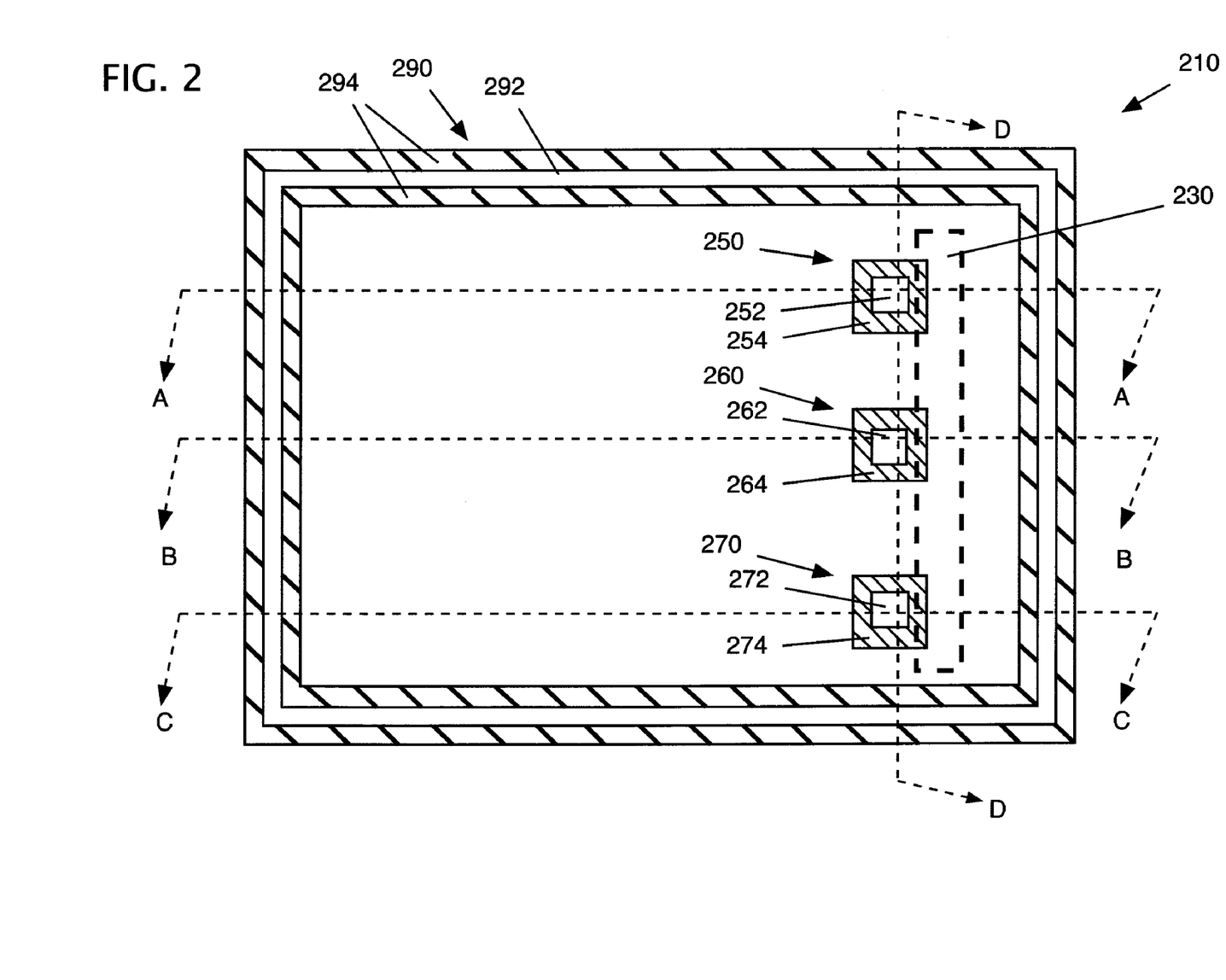
FIG. 2 shows a top view of a multi-diode pixel sensor according to an embodiment of the invention.

FIG. 2 shows a top view of an illustrative embodiment of a multi-diode pixel sensor 210 according to one embodiment of the invention. As shown, sensor 210 is bordered by optional surrounding deep trench 290, comprising a polycrystalline silicon (polysilicon) material 292 within an insulating material 294. Insulating material 294 may be any known or later-developed material, including, for example, silicon dioxide and polysilazane-based inorganic materials. Sensor 210 further includes three deep trenches 250, 260, 270, each connected to a photodiode (not shown) beneath the surface of sensor 210. Similar to surrounding deep trench 290, each deep trench 250, 260, 270 includes a polysilicon material 252, 262, 272 surrounded by an insulating material 254, 264, 274. The polysilicon and insulating materials of each deep trench 250, 260, 270 may be the same or different. Similarly, the polysilicon and insulating materials of the deep trenches 250, 260, 270 may be the same as or different from those of optional surrounding deep trench 290.

Figure 3:
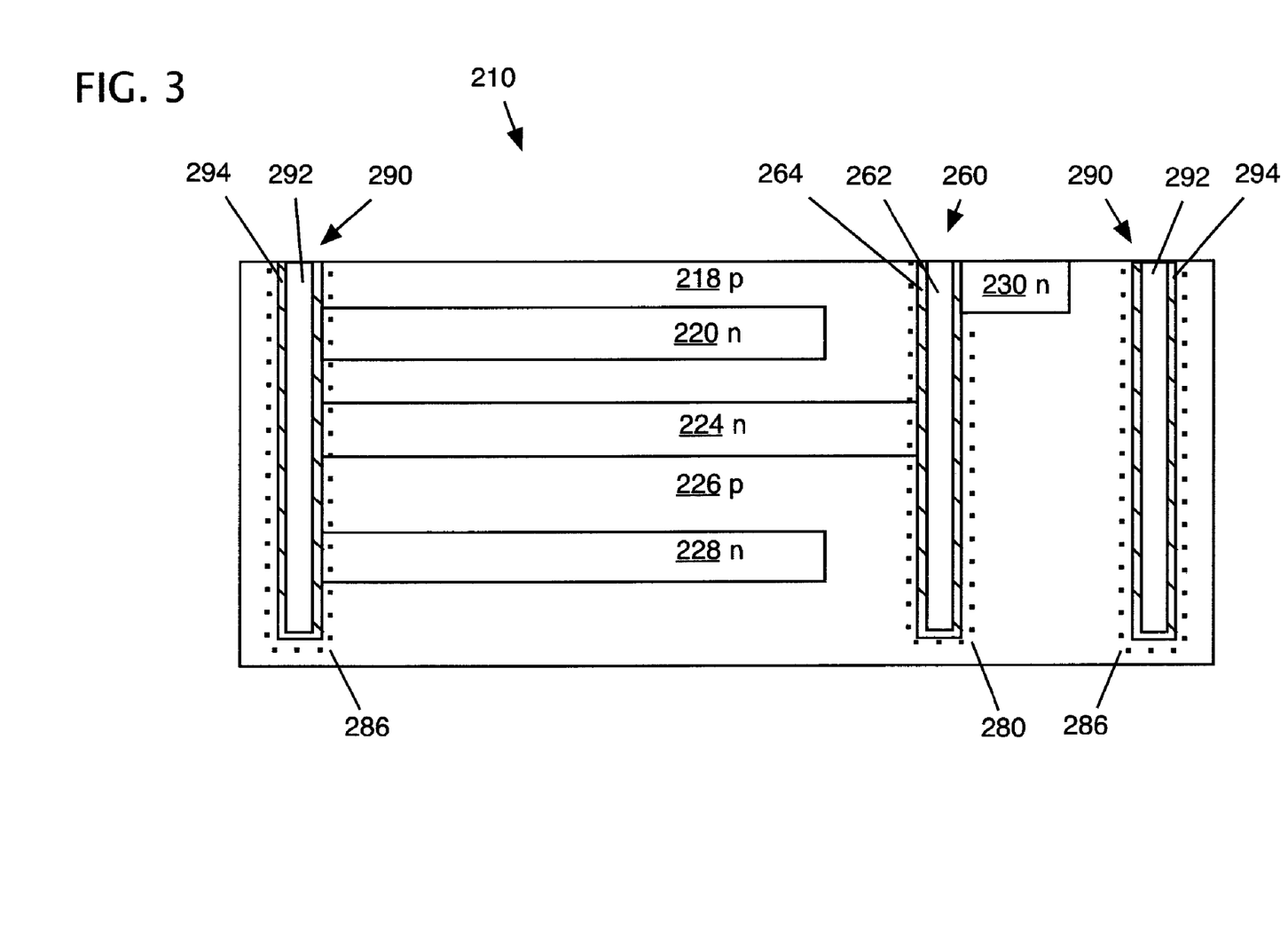
FIGS. 3-5 show cross-sectional views of a multi-diode pixel sensor according to an embodiment of the invention.
Figure 4:
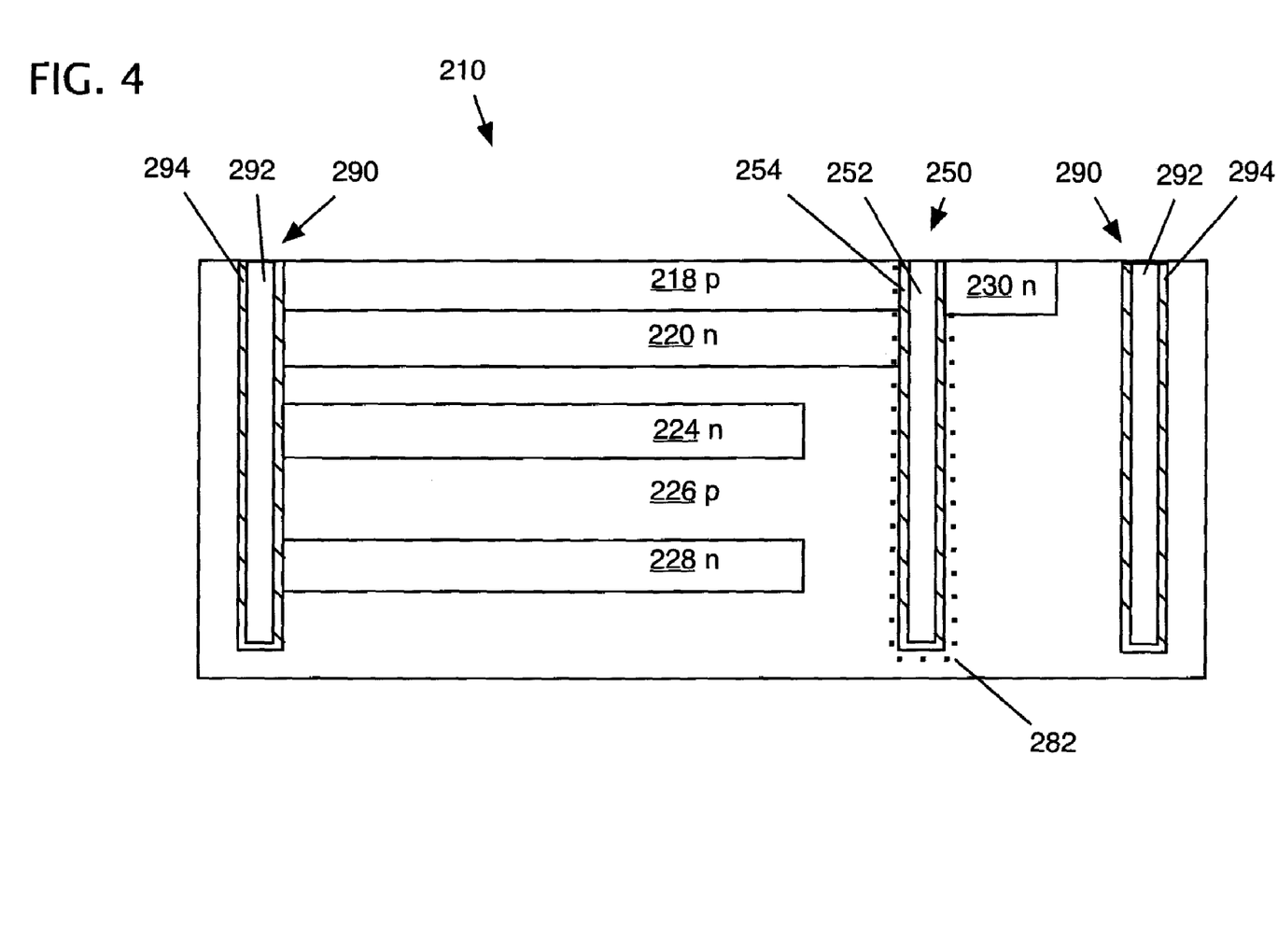
Figure 5:
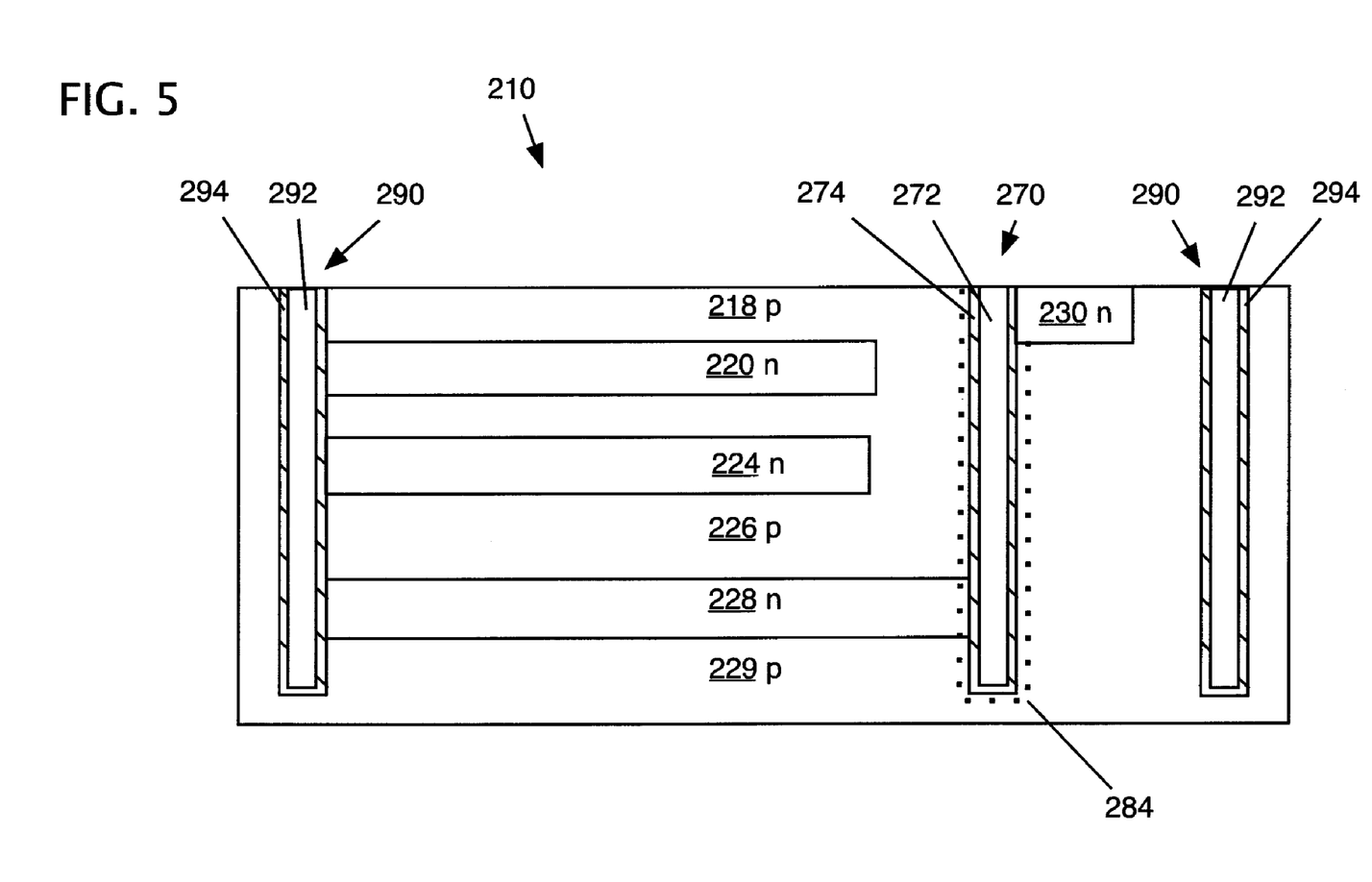

FIGS. 3-5 each respectively show the selective contact of each deep trench 250, 260, 270 with a photodiode buried in a semiconductor substrate. Referring now to FIG. 3, sensor 210 is shown in cross-section along line B of FIG. 2. A plurality of photodiodes is formed from alternating layers of n- and p-doped silicon. Unlike known devices, the uppermost layer of sensor 210 is a p-type layer 218. Such an arrangement isolates the electron collection region 220 from electron generation at the silicon surface and thus decreases or eliminates dark current in sensor 210.

Still referring to FIG. 3, a first photodiode comprises the junction between n-type well 220 and p-type well 218 (both above and below n-type well 220). P-type well 218 functions as the anode and n-type well 220 functions as the cathode. A second photodiode comprises the junction between a portion of p-type well 218 below n-type well 220, n-type well 224, and p-type well 226. A third photodiode comprises the junction between n-type well 228 and portions of p-type well 226 both above and below n-type well 228. As shown, deep trench 260 contacts only the second photodiode, and specifically, n-type well 224 of the second photodiode. One benefit of such an arrangement over known devices is that the lack of a high-dose contact region to the photodiode allows the photodiode to be fully depleted of its photocharges during a photodiode reset operation.

Another notable difference between the present invention and known devices is that the alternating layers of n- and p-doped silicon in the present invention do not return to the device surface. In known devices, the return of these layers to the device surface, and particularly the return of n-doped layers, results in electron generation at the device surface. As explained above, such electron generation increases dark current in the device, diminishing its usefulness as a photodetector.

Dark current may further be reduced in sensor 210 by negatively biasing surrounding deep trench 290. Doing so induces a p-type layer 286 adjacent an outer surface of surrounding deep trench 290, effectively accumulating p-type wells 218, 226 and surrounding or "pinning" n-type wells 220, 224, 228 with p-type layers 218, 226, 286. Such pinning results in little or no dark current in sensor 210.

As will be described in greater detail below, polysilicon 262 and insulating material 264 function as a field effect transistor (FET); polysilicon 262 as a gate and insulating material 264 as a gate dielectric. As such, applying a voltage to polysilicon 262 induces an inversion layer 280 along an outer surface of deep trench 260. Inversion layer 280 connects n-type well 224, acting as source, to drain 230, permitting flow of photocharges in n-type well 224 to drain 230. Thus, deep trenches 250, 260, 270 of the present invention function as photocharge transfer devices.

FIG. 4 shows sensor 210 in cross-section along line A of FIG. 2. Here, deep trench 250 contacts only the first photodiode, and specifically, n-type well 220 of the first photodiode. Inversion layer 282 may be formed along an outer surface of deep trench 250, connecting n-type well 220 and drain 230.

Similarly, FIG. 5 shows sensor 210 in cross-section along line C of FIG. 2. Deep trench 270 contacts only n-type well 228 of the third photodiode and inversion layer 284 is formed along an outer surface of deep trench 270, connecting n-type well 228 and drain 230.

As described above with respect to FIG. 1A, each photodiode of sensor 210 may be adapted to generate photocharges in response to different electromagnetic wavelengths through adjustment of the depth of the photodiode in the semiconductor substrate. For example, the photodiode of FIG. 3 may be adapted to generate photocharges in response to electromagnetic wavelengths of about 550 nm, the photodiode of FIG. 4 may be adapted to generate photocharges in response to electromagnetic wavelengths of about 450 nm, and the photodiode of FIG. 5 may be adapted to generate photocharges in response to electromagnetic wavelengths of about 650 nm. Alternatively, as will be described in greater detail below, in the case that sensor 210 is adapted to enhance the capacity of photocharge generation rather than the detection of particular electromagnetic wavelengths, each of a plurality of photosensors may be connected to a single deep trench.

Figure 6:
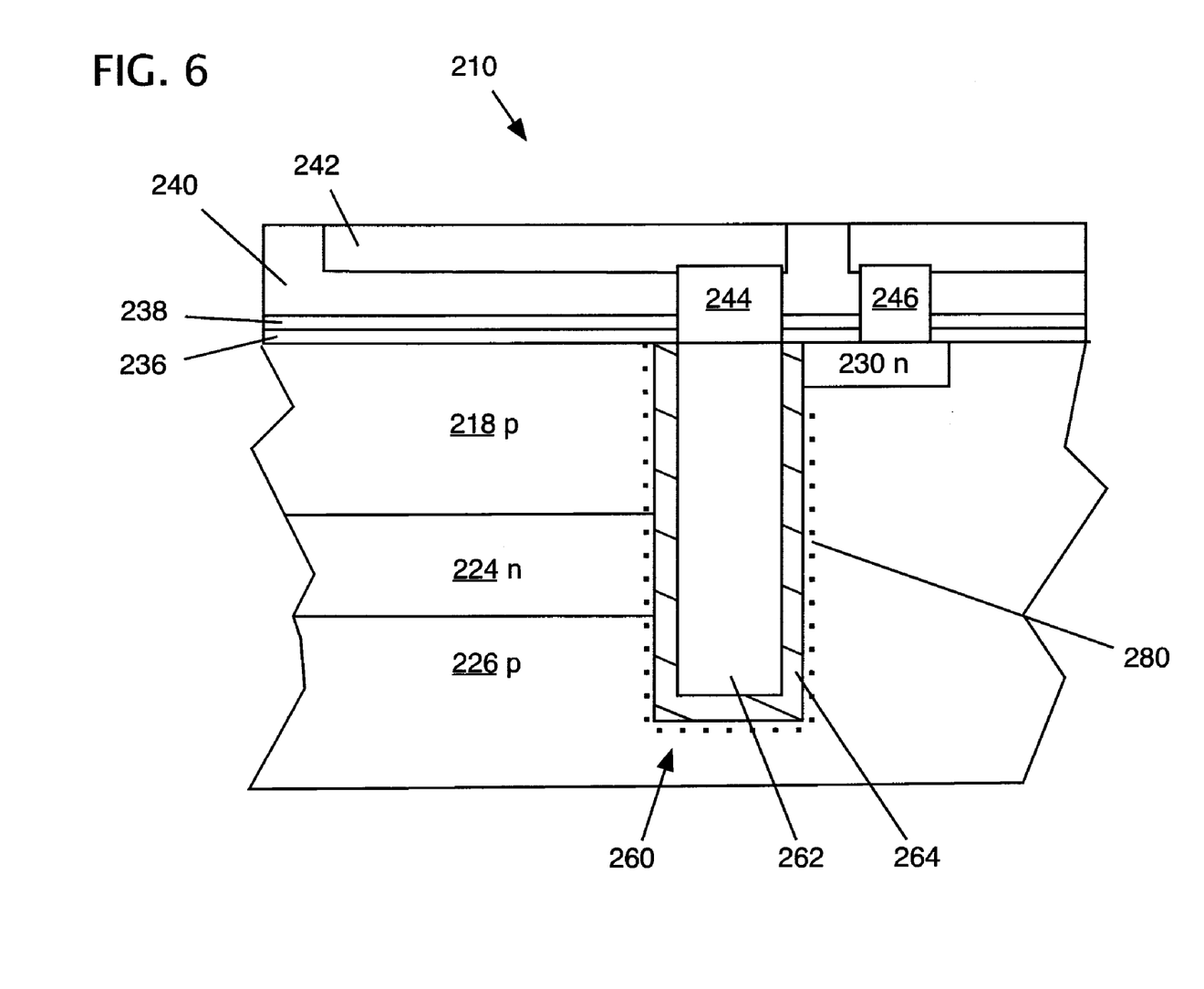
FIGS. 6-9 show detailed cross-sectional views of alternative embodiments of multi-diode pixel sensors according to the invention.

Referring now to FIG. 6, a detailed view of an illustrative embodiment of sensor 210 is shown. As in FIG. 3, deep trench 260 contacts n-type well 224 of the second photodiode. Atop p-type well 218 are layered a silicon dioxide layer 236 and silicon nitride layer 238, a boron-doped phosphosilicate glass (BPSG) 240, and a metal 242. Each layer atop p-type well 218 may be formed using known or later-developed techniques, including lithographic and deposition techniques.

As described above, polysilicon 262 and insulating material 264 comprise a FET, with polysilicon 262 functioning as a gate. Atop polysilicon 262 is formed a gate contact 244 and atop drain 230 is formed a diffusion contact 246. Biasing gate contact 244 to a high potential induces an inversion layer 280 along an outer surface of deep trench 260. Once induced, inversion layer 280 connects n-type well 224 to drain 230, permitting the flow of photocharges from n-type well 224 to diffusion contact 246 and on to device circuitry (not shown) external to sensor 210. Sensor 210 of FIGS. 3-6 permits the electrons of each photodiode to be transmitted independently or in combination with the electrons of any other photodiode desired. However, as will be recognized by one having skill in the art, the polarities of the layers of sensor 210 may be reversed, i.e., layer 218 being n-type, layer 220 being p-type, layer 224 being n-type, etc. The only difference between such a sensor and those described above is that such a sensor will collect holes rather than electrons.

As described above, p-type well 218 reduces or eliminates surface electron generation and therefore reduces or eliminates dark current in sensor 210. However, as described above with respect to FIG. 3, it is possible to further reduce dark current by pinning n-type well 224. To do so, gate contact 244 is negatively biased (e.g., at about −1 V). Negative biasing induces a p-type (hole) layer (as opposed to the n-type (electron) inversion layer for transmitting photocharges) along an outer surface of deep trench 260. Once p-type layer is induced, n-type well 224 is completely surrounded, or "pinned," by p-type layers. As noted above, such pinning results in little or no dark current in sensor 210. Preferably, gate contact 244 (and therefore deep trench 260) may be alternately biased positive and negative.

Figure 7:
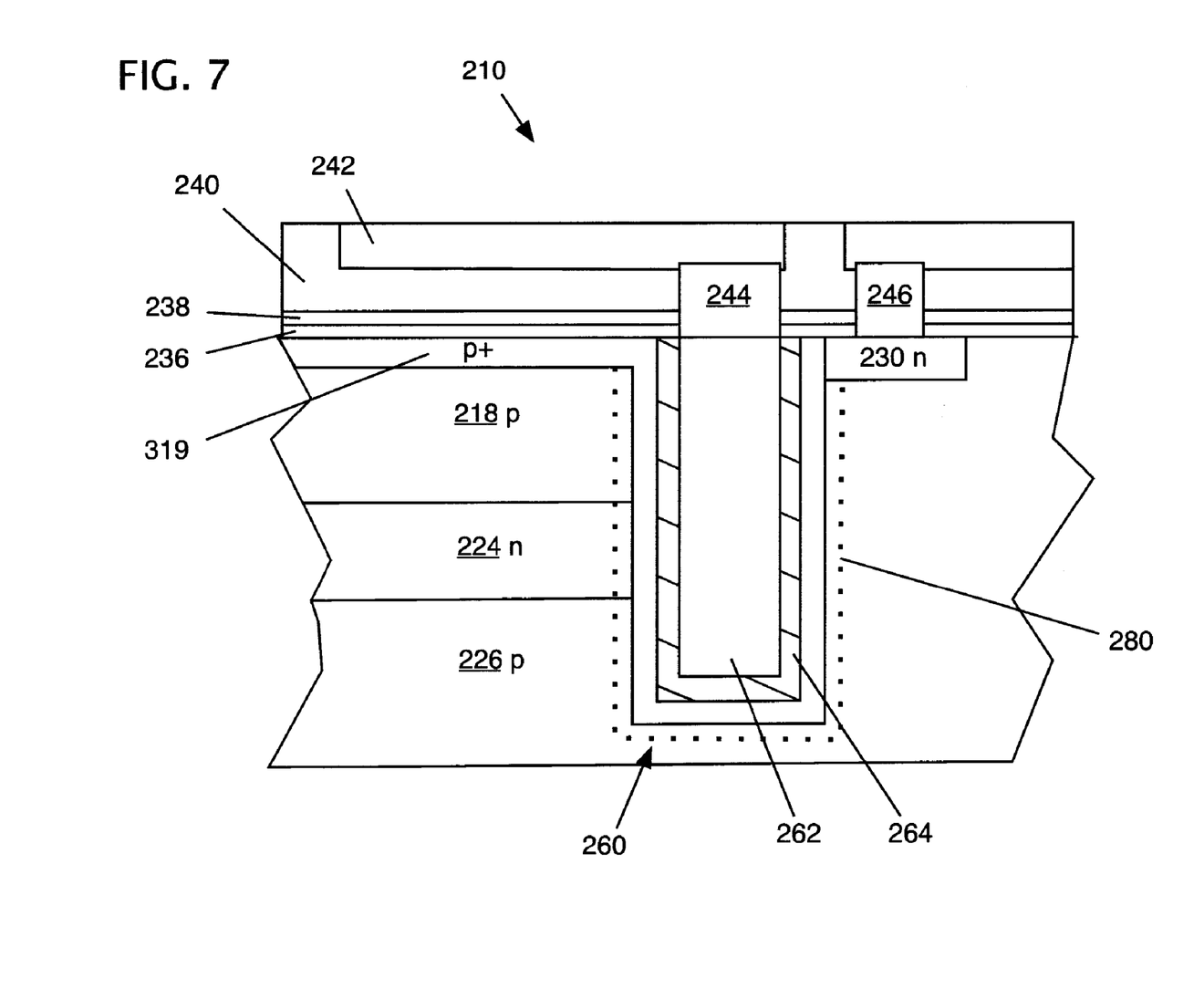

Referring now to FIG. 7, surface electron generation may be further reduced or eliminated by forming a heavily-doped p-type well 319 atop p-type well 218 and along an outer surface of deep trench 260. As such, n-type well 224 is pinned, or surrounded by p-type layers, but does not rely on negative biasing of gate contact 244, as above. As shown, upon the positive biasing of gate contact 244, inversion layer 280 is induced from n-type well 224 to drain 230 rather than along an entire outer surface of deep trench 260, as shown in FIG. 6.

Figure 8:
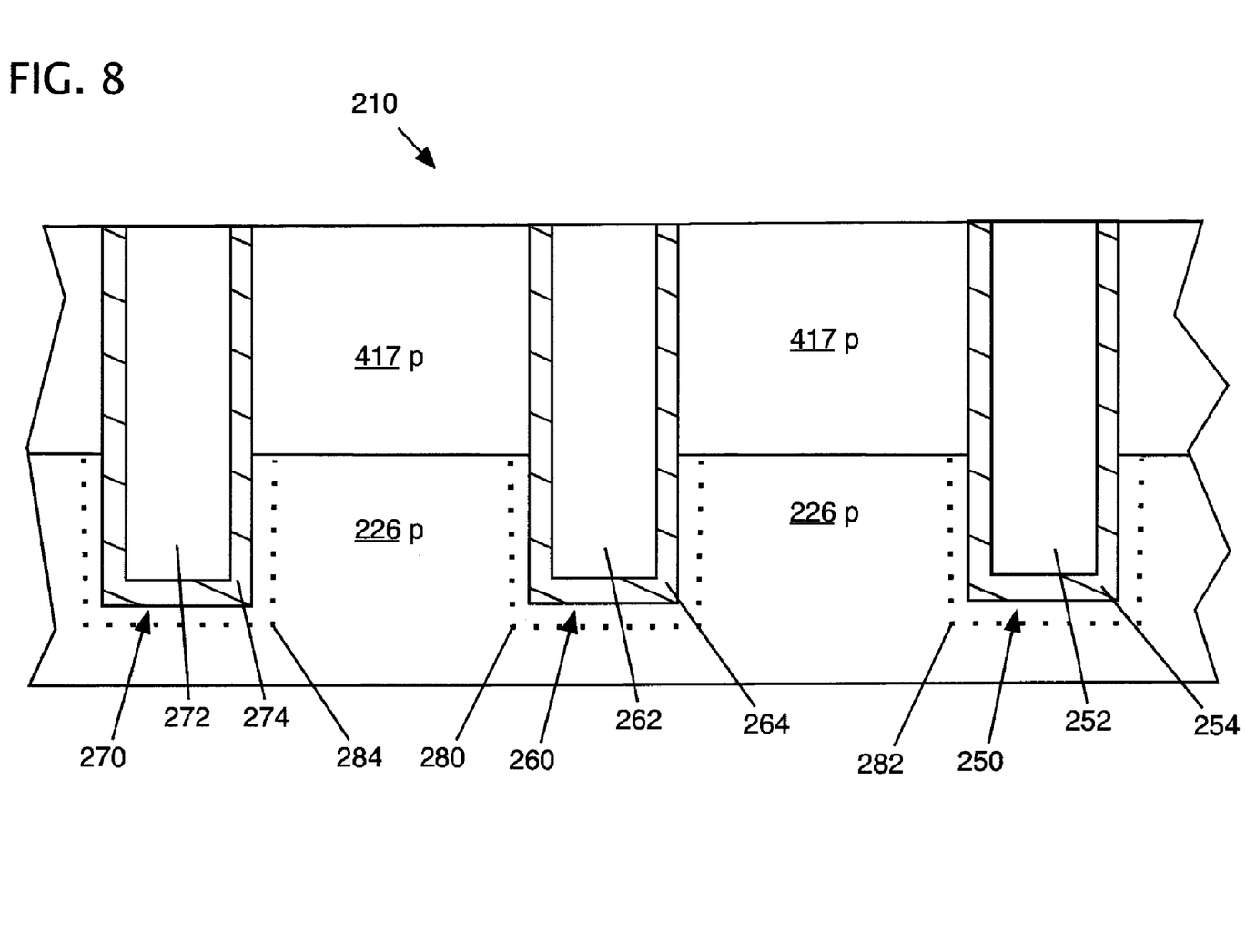

FIG. 8 shows a cross-sectional view of sensor 210 taken along line D of FIG. 2. Here, a blocking p-type well 417 is disposed between adjacent trenches 250, 260, 270, which forces electrons (or holes, if well polarities are reversed) to travel along induced inversion layers 280, 282, 284. That is, electrons (or holes) are forced to follow inversion layer 280 down a side of the trench, e.g., 260 (FIG. 6) adjacent the photodiode (e.g., junction of 218 and 224 in FIG. 6), under trench 260, and back up a side of trench 260 adjacent drain 230 (FIG. 6). Such an arrangement prevents inadvertent leakage of charges between the n photodiode layer 220 and n layer 230 (FIG. 4) when gate 262 is turned off.

Figure 9:
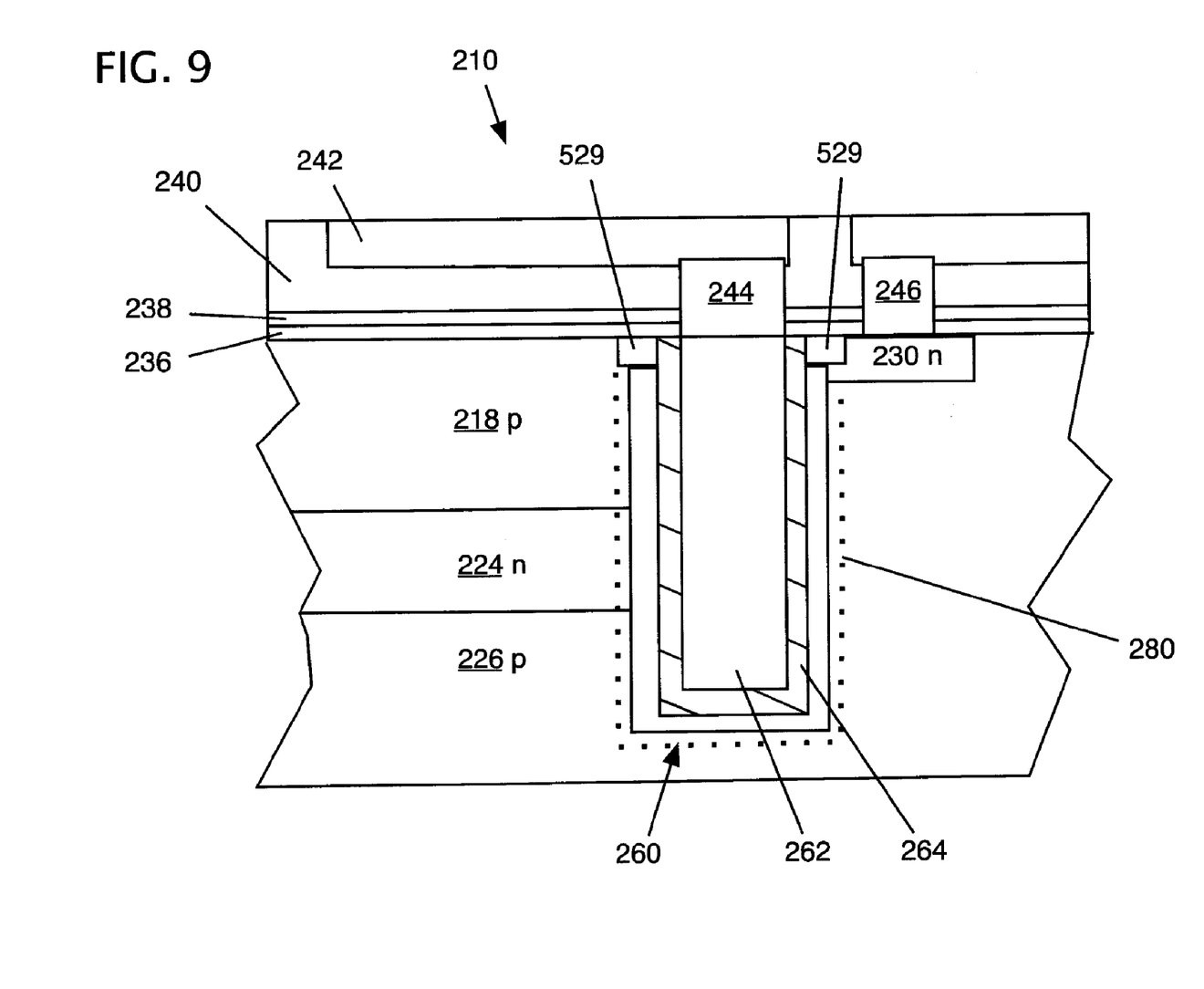

Referring now to FIG. 9, another embodiment of the invention is shown, wherein deep trench 260 is a buried channel device due to the addition of p type dopants surrounding the trench and optional shallow trench isolations (STIs) 529. "Burying" deep trench 260 in this manner, and biasing the trench appropriately, avoids electron generation along sidewall surfaces of deep trench 260, another source of dark current.

Figure 10:
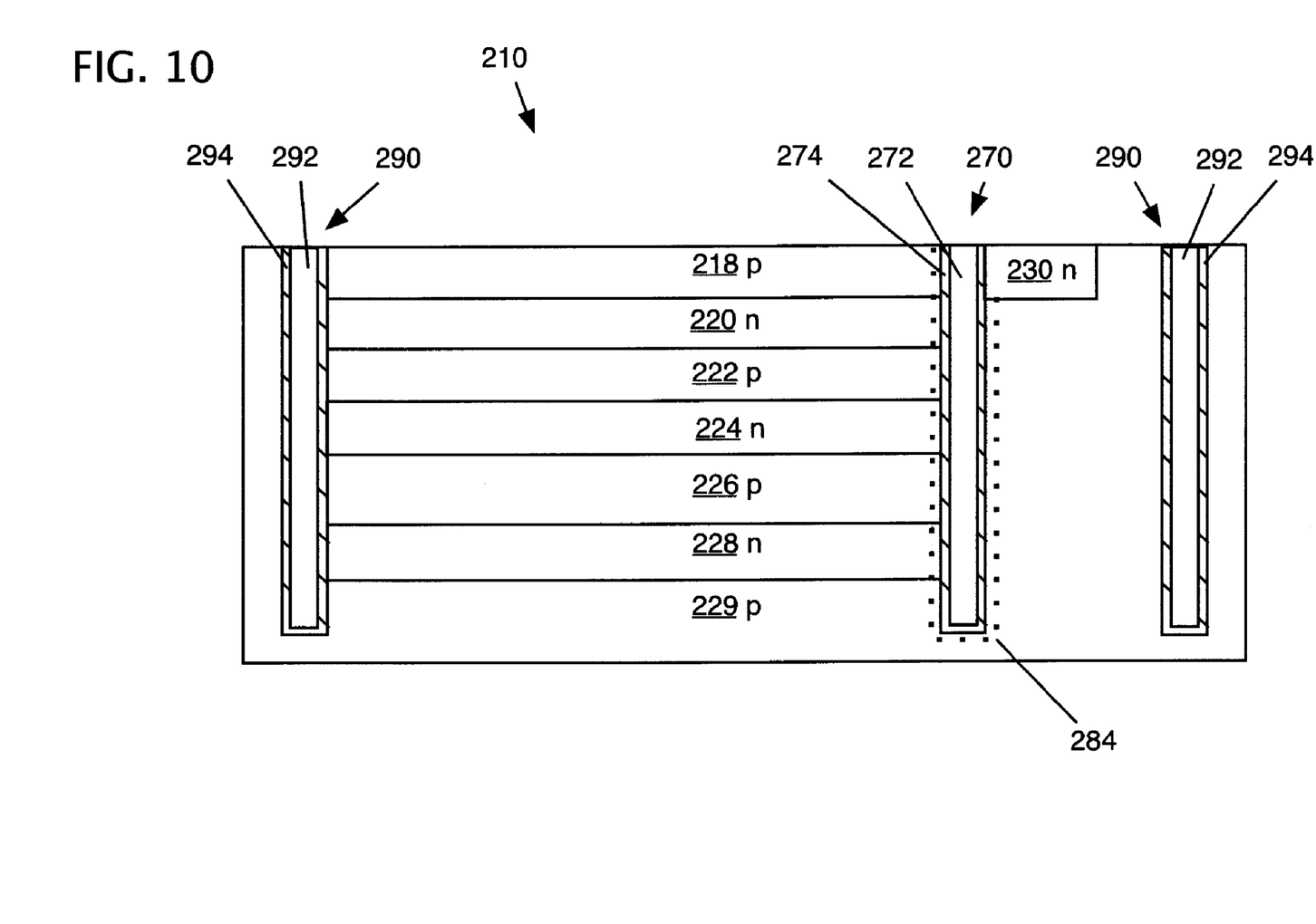
FIG. 10 shows a cross-sectional view of an alternative embodiment of a multi-diode pixel sensor according to an embodiment of the invention.

FIG. 10 shows a cross-sectional view of sensor 210 according to an alternative embodiment of the invention. As shown in FIG. 10, each photodiode is connected to deep trench 270. Such an embodiment may be employed, for example, to enhance the capacity of sensor 210 to generate photocharges. Any number of vertically-stacked photodiodes may be so employed, with two or more such photodiodes connected in parallel to a single deep trench. Each photodiode may be adapted to generate photocharges in response to different electromagnetic wavelength, although this is not required.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

What is claimed is:

1. A pixel sensor comprising:
 a plurality of photosensitive elements formed at varying depths in a substrate, each photosensitive element including a p-n junction photodiode having a p-type layer and an n-type layer and being adapted to generate photocharges in response to electromagnetic radiation, and wherein the shallowest photosensitive element in the substrate includes a p-type layer residing above an n-type layer, wherein the shallowest p-type layer isolates the shallowest n-type layer from contact with a surface of the pixel sensor; and
 a plurality of photocharge transfer devices, a first photocharge transfer device being coupled to a first n-type cathode of a first photosensitive element and a second photocharge transfer device being coupled to a second n-type cathode of a second photosensitive element, wherein the second photosensitive element is located directly over the first photosensitive element, and wherein the second photosensitive element shares a p-type layer with the first photosensitive element.

2. The pixel sensor of claim 1, wherein each photocharge transfer device includes a trench structure formed in the substrate adjacent a photosensitive element.

3. The pixel sensor of claim 2, wherein each trench structure includes:
 a dielectric along a portion of an inner surface of the trench structure; and
 a polysilicon material within the trench structure.

4. The pixel sensor of claim 3, wherein the trench structure is adapted to be alternately biased positive and negative.

5. The pixel sensor of claim 3, wherein each trench structure is adapted to induce an inversion layer along an outer surface.

6. The pixel sensor of claim 5, wherein the inversion layer transfers the photocharges from the photosensitive element.

7. The pixel sensor of claim 1, wherein each of the plurality of photocharge transfer devices is coupled to a diffusion contact.

8. The pixel sensor of claim 1, wherein a first photosensitive element is adapted to generate photocharges in response to electromagnetic wavelengths of about 650 nm, a second photosensitive element is adapted to generate photocharges in response to electromagnetic wavelengths of about 550 nm, and a third photosensitive element is adapted to generate photocharges in response to electromagnetic wavelengths of about 450 nm.

9. The pixel sensor of claim 1, wherein at least one of the plurality of photosensitive elements is adapted to completely discharge the photocharges.

10. The pixel sensor of claim 1, wherein the shallowest p-type layer resides both above the shallowest n-type layer and below the shallowest n-type layer.

11. A pixel sensor comprising:
a plurality of photodiodes formed at varying depths in a substrate, each photodiode including a p-n junction having a p-type layer and an n-type layer, and wherein the shallowest photodiodes element in the substrate includes a p-type layer residing above an n-type layer, wherein the shallowest p-type layer isolates the shallowest n-type layer from contact with a surface of the pixel sensor;
a plurality of photocharge transfer devices, each photocharge transfer device being coupled to a different n-type cathode among the plurality of photodiodes, wherein the second photosensitive element is located directly over the first photosensitive element, and wherein the second photosensitive element shares a p-type layer with the first photosensitive element; and
at least one of the following:
a heavily-doped p-type layer adjacent at least one photocharge transfer device and a p-type well of at least one photodiode;
a blocking p-type layer adjacent a p-type well of at least one photodiode; and
a shallow trench isolation adjacent at least one of the photocharge transfer devices.

12. The pixel sensor of claim 11, wherein at least one of the heavily-doped p-type layer, the blocking p-type layer, and the shallow trench isolation is adapted to reduce dark current in the pixel sensor.

13. The pixel sensor of claim 11, wherein each photocharge transfer device includes a trench structure formed in the substrate adjacent a photodiode, each trench structure including:
a dielectric along a portion of an inner surface of the trench structure; and
a polysilicon material within the trench structure.

14. The pixel sensor of claim 13, wherein the trench structure is adapted to be alternately biased positive and negative.

15. The pixel sensor of claim 13, wherein each trench structure is adapted to induce an inversion layer along an outer surface, and wherein the inversion layer transfers photocharges from a photodiode.

16. The pixel sensor of claim 11, wherein the shallowest p-type layer resides both above the shallowest n-type layer and below the shallowest n-type layer.

17. A pixel sensor comprising:
a plurality of photosensitive elements formed at varying depths in a substrate, each photosensitive element including a p-n junction photodiode having a p-type layer and an n-type layer and being adapted to generate photocharges in response to electromagnetic radiation, and wherein the shallowest photosensitive element in the substrate includes a p-type layer residing above an n-type layer, wherein the shallowest p-type layer isolates the shallowest n-type layer from contact with a surface of the pixel sensor;
a plurality of photocharge transfer devices, each coupled to a different n-type cathode among the plurality of photosensitive elements, wherein the second photosensitive element is located directly over the first photosensitive element, and wherein the second photosensitive element shares a p-type layer with the first photosensitive element; and
a deep trench in the substrate surrounding each of the plurality of photosensitive elements and the at least one photocharge transfer device.

18. The pixel sensor of claim 17, wherein the deep trench is adapted to induce a p-type layer along an outer surface in the case that the deep trench is negatively biased.

19. The pixel sensor of claim 18, wherein the p-type layer isolates an n-type well of at least one photodiode within the p-type layer and at least one p-type well of at least one photodiode.

20. The pixel sensor of claim 17, wherein the shallowest p-type layer resides both above the shallowest n-type layer and below the shallowest n-type layer.

* * * * *